United States Patent
Tada et al.

(10) Patent No.: US 6,451,388 B1
(45) Date of Patent: *Sep. 17, 2002

(54) METHOD OF FORMING TITANIUM FILM BY CHEMICAL VAPOR DEPOSITION

(75) Inventors: Kunihiro Tada, Nirasaki; Hayashi Otsuki, Naka-koma-gun, both of (JP)

(73) Assignee: Tokyo Electron Limited, Tokyo-To (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/713,008

(22) Filed: Nov. 16, 2000

Related U.S. Application Data

(63) Continuation-in-part of application No. 09/216,938, filed on Dec. 21, 1998, now Pat. No. 6,177,149.

(30) Foreign Application Priority Data

Dec. 24, 1997 (JP) .............................................. 9-366066

(51) Int. Cl.⁷ ................................................. H05H 1/24
(52) U.S. Cl. ................ 427/576; 427/253; 427/255.391; 427/255.394; 438/648; 438/656; 438/685
(58) Field of Search ................................ 427/576, 573, 427/255.394, 253, 255.391; 438/637, 648, 656, 680, 685

(56) References Cited

U.S. PATENT DOCUMENTS 6,177,149 B1 * 1/2001 Tada et al. .................. 427/576

* cited by examiner

*Primary Examiner*—Bret Chen
(74) *Attorney, Agent, or Firm*—Smith, Gambrell & Russell, LLP

(57) ABSTRACT

A Ti film is formed by chemical vapor deposition in holes formed in an insulating film formed on a Si substrate or on a Si film formed on a Si substrate by a method comprising the steps of: loading a Si substrate into a film forming chamber; evacuating the chamber at a predetermined vacuum; supplying $TiCl_4$ gas, $H_2$ gas, Ar gas and $SiH_4$ gas into the film forming chamber; and producing a plasma in the film forming chamber to deposit a Ti film in the holes formed in the insulating film. The Si substrate is heated at a temperature of from 550 to 700° C. during the deposition of the Ti film, and the flow rates of the processing gases are regulated so that Si-to-insulator selectivity is not less than one. This method enables formation of a Ti film on a Si base at positions of holes in an insulating layer, with a good morphology of the interface between the Si base and the Ti film and with a good step coverage.

18 Claims, 6 Drawing Sheets

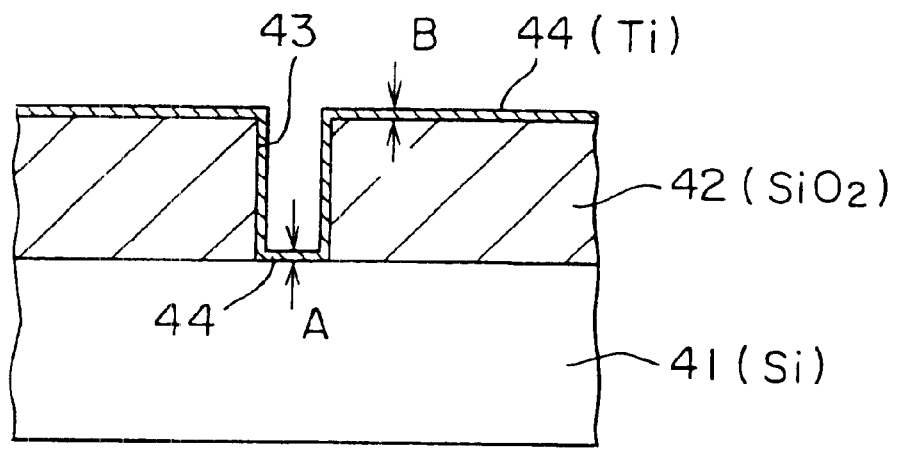
F I G. 2A
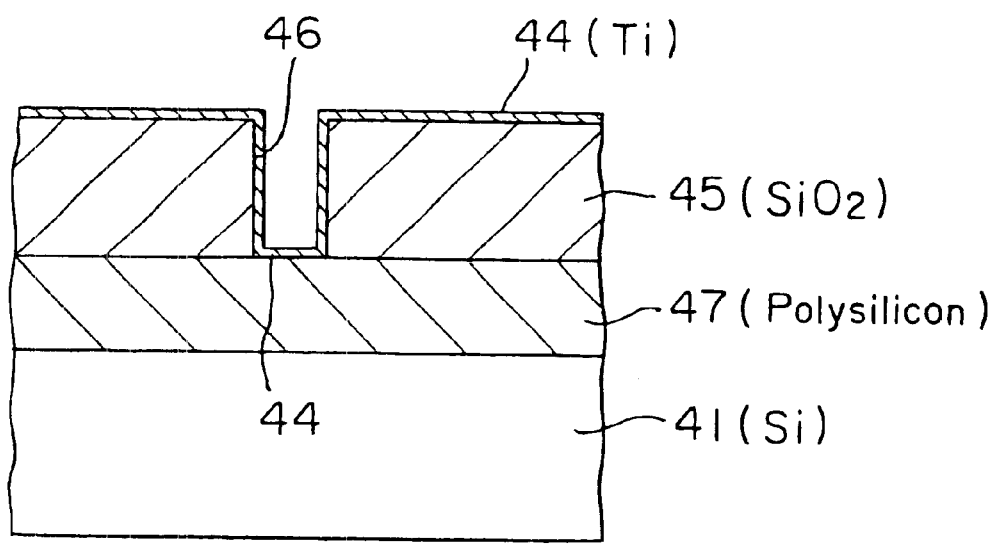
F I G. 2B

METHOD OF FORMING TITANIUM FILM BY CHEMICAL VAPOR DEPOSITION

CROSS-REFERENCE TO RELATED APPLICATION

This is a continuation-in-part application of our application Ser. No. 09/216,938 filed Dec. 21, 1998 now U.S. Pat. No. 6,177,149.

BACKGROUND OF THE INVENTION

1. Field of the Invention

The present invention relates to a method of forming a titanium (Ti) film to be used as a contact metal film or an adhesion layer for a semiconductor device by a chemical vapor deposition (CVD) process.

2. Description of the Related Art

Recently, most semiconductor integrated circuits are fabricated in a circuit configuration of a multilevel structure to cope with market demand for high-density and large-scale integration. Accordingly, techniques for filling contact holes for the electrical connection of semiconductor devices formed in a lower layer to wiring lines formed in upper wiring layers, and via holes for the electrical connection of wiring lines in different wiring layers have become important.

Generally, aluminum (Al), tungsten (W), aluminum-base alloys and tungsten-base alloys are used for filling contact holes and via holes. If a contact hole (or a via hole) is filled with such a metal or an alloy, which is in direct contact with an aluminum (Al) wiring line or a silicon (Si) substrate in a lower layer, it is possible that an alloy of silicon and aluminum is produced in the boundary owing to the diffusion of Al and Si. Such an alloy has a high resistivity and is undesirable in view of need to reduce the power consumption and to increase the operating speed of integrated circuits If W or a W-base alloy is used for filling a contact hole, $WF_6$ gas as a source gas for depositing W or the W-base alloy tends to deteriorate the electrical properties of the Si substrate.

To avoid such problems, a barrier layer is formed on surfaces defining contact holes or via holes before filling the contact holes and the via holes with the filling metal. Generally, a two-layer barrier layer consisting of a Ti film and a titanium nitride ( TiN) film is used as the barrier layer. It has been the usual way to form such a barrier layer by a physical vapor deposition (PVD) process. However, a PVD film has a poor coverage and is incapable of meeting the requirements of tight design rule, the reduction of the width of lines and diameter of openings and the increase of aspect ratio to meet the recent demand for the enhancement of the level of integration and the miniaturization of IC chips.

Recently, Ti films and TiN films have been formed by a CVD process capable of forming such films in a better film quality than the PVD process. The Ti film serving as a contact metal film is formed by a plasma CVD process. Usually, the plasma CVD process for forming a Ti film uses $TiCl_4$ gas as a source gas, $H_2$ gas and Ar gas. During the plasma CVD process, Si forming the substrate and Ti contained in the source gas interact and Si diffuses in the Ti layer, deteriorating the morphology of a $TiSi_x$ (typically, $TiSi_2$) interfacial layer formed between the Si substrate and the Ti layer. The diffusion of Si into the Ti layer is liable to cause junction leakage when the Ti layer is used for filling a contact hole and affects adversely to electrical connection when the same is used for filling a via hole.

The aspect ratio of contact holes and via holes formed in $SiO_2$ insulating films has increased with the progressive miniaturization of IC chips. Therefore, the Ti film is required to be formed in a satisfactory step coverage.

The present invention has been made in view of the above and it is an object of the present invention to provide a method of forming a Ti film by CVD, capable of forming a Ti film in minute holes formed in an insulating film in a satisfactory step coverage without deteriorating the morphology of a $TiSi_x$ interfacial layer formed between the Ti film and a Si base.

SUMMARY OF THE INVENTION

According to the present invention, there is provided a method of forming a titanium film by chemical vapor deposition in holes formed in an insulating film provided on a silicon base, the method comprising the steps of: loading a silicon base having thereon an insulating film formed with holes into a film forming chamber; evacuating the chamber at a predetermined vacuum; supplying processing gases including $TiC_4$ gas, a reduction gas, Ar gas and $SiH_4$ gas into the film forming chamber; and producing a plasma in the film forming chamber to deposit a titanium film in the holes formed in the insulating film, while said silicon base is heated at a temperature of from 550 to 700° C., and while said $TiCl_4$ gas and said $SiH_4$ gas are supplied with a flow rate of the $SiH_4$ gas being from 1 to 50% of a flow rate of the $TiCl_4$ gas, to thereby obtain a silicon-to-insulating film selectivity of not less than one.

The flow rates of the processing gases may be selected so that the silicon -to-insulating film selectivity is three or more. $SIH_4$ may have a flow rate which is from about 0.005 to about 0.25% of the flow rate of all of the processing gases. The temperature of the silicon base during the film formation is preferably from 580 to 700° C. $H_2$ gas is used most advantageously as the reduction gas.

The inventors of the present invention made studies to form a Ti film by CVD in a satisfactory step coverage without deteriorating the morphology of the $TiSi_x$ layer and found that such a Ti film can be formed when the temperature of the substrate is 550° C. or more, SiH4 gas is used in addition to $TiCl_4$ gas, $H_2$ gas and Ar gas, and the respective flow rates of those processing gases are adjusted properly.

The deterioration of the morphology of the $TiSi_x$ interfacial layer formed between the Ti film and the Si base is caused by the interaction of Si and Ti, and the irregular diffusion of Si into the Ti film during the formation of the Ti film. $SiH_4$ gas suppresses the irregular diffusion of Si into the Ti film to prevent the deterioration of the morphology of the $TiSi_x$ layer. However, since $SiH_4$ gas is a reducing gas, $TiSi_x$ is produced by the interaction of $SiH_4$ gas and $TiCl_4$ gas and such a reaction deteriorates the step coverage.

To utilize the function of $SiH_4$ to avoid deteriorating the morphology of the $TiSi_x$ layer without deteriorating the step coverage of the CVD-Ti film, it is effective to increase the silicon-to-insulating film selectivity by heating the substrate at 550° C. or more during the film forming process, and to adjust the flow rates of the processing gases, particularly, the flow rate of $SiH_4$ gas, so that the silicon-to-insulating film selectivity is not less than one. The present invention has been made on the basis of such knowledge.

The above and other objects, features and advantages of the present invention will become more apparent from the following description taken in connection with the accompanying drawings.

BRIEF DESCRIPTION OF THE DRAWINGS

FIGS. 2A and 2B are fragmentary sectional views of Si substrates to which the present invention is applied;

DESCRIPTION OF THE PREFERRED EMBODIMENTS

Figure 1:
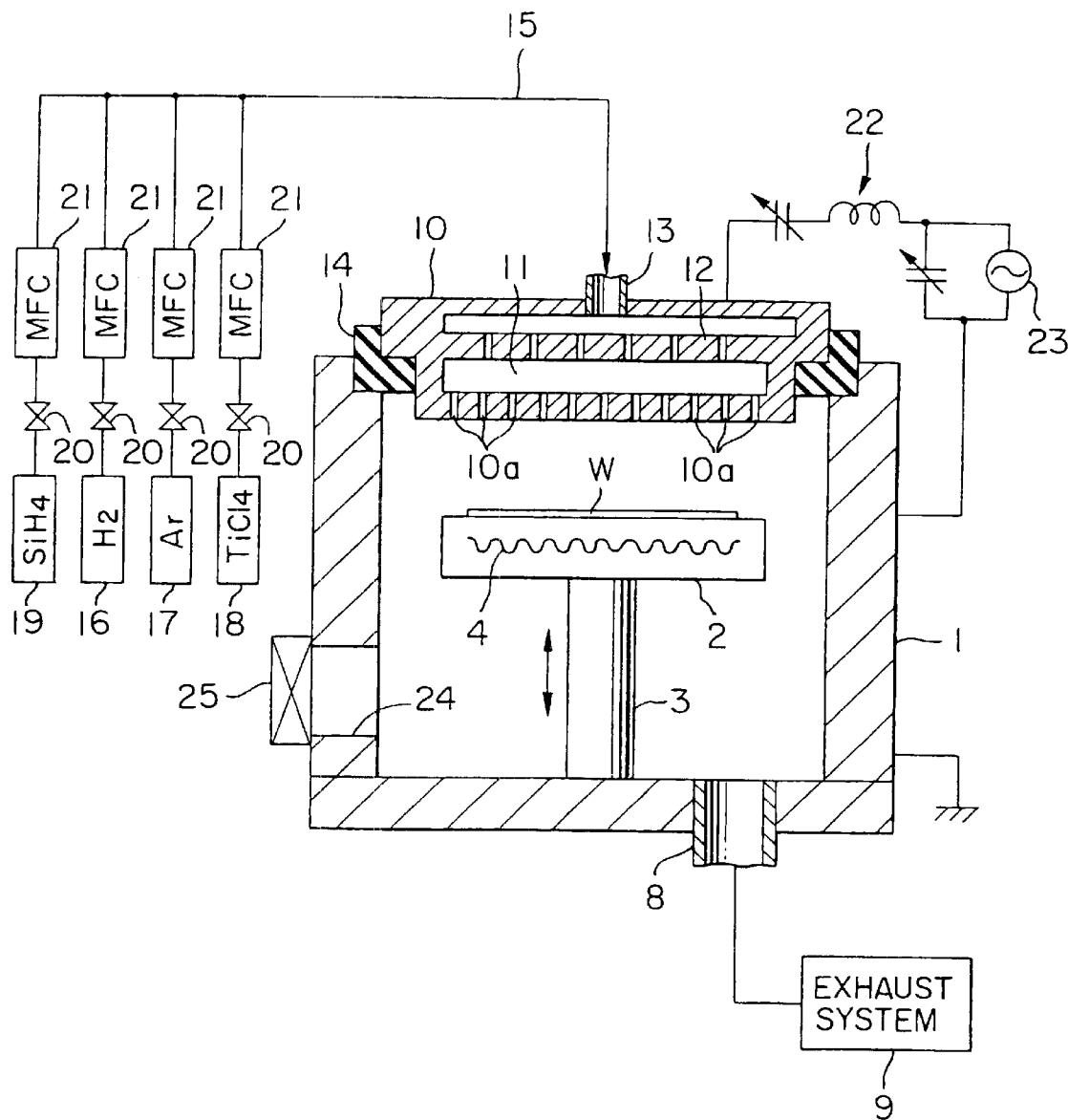
FIG. 1 is a sectional view of a film forming system for carrying out a method of forming a Ti film by chemical vapor deposition in a preferred embodiment of the present invention.

Referring to FIG. 1, a film forming system for carrying out a method of forming a titanium (Ti) film by chemical vapor deposition (CVD) in a preferred embodiment of the present invention has a substantially cylindrical vessel 1 defining an airtight film forming chamber, a susceptor 2 for supporting a silicon (Si) wafer or substrate W, i.e., an object to be processed, in a horizontal attitude thereon, and a cylindrical support member 3 supporting the susceptor 2 for vertical movement. A heating element 4 is embedded in the susceptor 2. Power is supplied by a power source, not shown, to the heating element 4 to heat a silicon (Si) wafer W supported on the susceptor 2 at a predetermined temperature.

A shower head 10 is disposed on the upper wall of the vessel 1 so as to face a Si wafer W supported on the susceptor 2. The shower head 10 has a lower wall provided with a plurality of gas discharge holes 10a and facing a Si wafer W supported on the susceptor 2, a space 11, a perforated diffusing wall 12 formed in the space 11, and an upper wall provided with a gas supply port 13. A gas supply pipe 15 is connected to the gas supply port 13.

The gas supply pipe 15 is connected to hydrogen (H) gas source 16, an argon (Ar) gas source 17, a titanium tetrachloride ($TiCl_4$) gas source 18 and a silane ($SiH_4$) gas source 19 through mass flow controllers 21 and valves 20. The processing gases are supplied from the gas sources 16, 17, 18 and 19 through the gas supply pipe 15 and the shower head 10 into the film forming chamber defined by the vessel 1, whereby a titanium (Ti) film is formed on the silicon wafer.

A radio frequency power source 23 is connected through a matching circuit 22 to the shower head 10 to apply a radio frequency voltage to the shower head 10. The processing gases are ionized in the vessel 1 by radio frequency power supplied to the shower head 10 to produce a plasma of the source gas in the vessel 1. The shower head 10 is electrically isolated from the vessel 1 by an insulating member 14, and the vessel 1 is grounded.

The bottom wall of the vessel 1 is provided with an exhaust port 8. An exhaust system 9 for evacuating the vessel 1 is connected to the exhaust port 8. The vessel 1 has a side wall provided in its lower part with an opening 24. A gate valve 25 is disposed in the opening 24 to open and close the opening 24. The gate valve 25 is opened and the susceptor 2 is lowered to its lower position when carrying a wafer W into and carrying the same out of the vessel 1 through the opening 24.

When forming a Ti film by the film forming system, the gate valve 25 is opened, a Si wafer W is loaded into the vessel 1 and is mounted on the susceptor 2, the Si wafer W is heated by the heating element 4, the vessel is evacuated to a high vacuum by a vacuum pump included in the exhaust system 9, $TiCl_4$ gas, $H_2$ gas, Ar gas and $SiH_4$ gas are supplied into the vessel 1, and a radio frequency voltage is applied to the shower head 10 by the radio frequency power source 23 to produce a plasma in the shower head 10.

As shown in FIG. 2A, the Si wafer W on which a Ti film is to be formed is, for example, a Si substrate 41 provided with an insulating film 42 of $SiO_2$ and contact holes 43 (only one of them is shown) formed in the insulating film 42 or, as shown in FIG. 2B, a Si substrate 41 provided with a polysilicon film 47 formed on the Si substrate 41, an insulating film 45 of $SiO_2$ formed on the polysilicon film 47, and via holes 46 (only one of them is shown) as shown in FIG. 2B. An insulating layer may be formed between the Si substrate 41 and the polysilicon film 47. The Si substrate 41 and the polysilicon film 47 will generally be referred to as "silicon base".

In this embodiment, $SiH_4$ gas is used and process conditions are determined so that Si-to-$SiO_2$ selectivity is not less than one to deposit a Ti film 44 on the bottoms of the contact holes 43 or the bottoms of the via holes 46 in a high step coverage, maintaining an interfacial layer formed between the Si base 41 and the Ti film 44 in a satisfactory morphology (conditions of the surface and section of the interfacial layer). That is, process conditions are determined so that Ti is deposited on portions of the surface of the Si wafer 41 forming the bottom surfaces of the contact holes 43 or on portions of the polysilicon film 47 forming the bottom surfaces of the via holes 46, at a deposition rate higher than that at which Ti is deposited on the surface of the insulating film 42 of $SiO_2$ or the insulating film 45 of $SiO_2$. More concretely, the Si substrate 41 (or Si substrate 41 including the polysilicon film 47) is heated at a temperature of from 550 to 700° C. to increase the Ti deposition rate on the Si substrate 41, and the flow rates of the processing gases, particularly, the flow rate of $SiH_4$ gas is controlled as described later so that Si-to-$SiO_2$ selectivity is one or above. Thus, the Ti film can be formed in high step coverage in the contact hole 43 or the via hole 46; that is, the thickness of the Ti film at the top of the contact hole 43 or the via hole 46 is not great. When Si-to-$SiO_2$ selectivity is three or above, the Ti film can be formed in a more satisfactory step coverage. The step coverage is expressed as A/B where A is the thickness of a Ti film formed on the Si substrate 41 in FIGS. 2A and B is the thickness of a Ti film formed on the $SiO_2$ layer 42.

To form an interfacial layer of a satisfactory morphology and securing a high Si-to-$SiO_2$ selectivity, a preferable $SiH_4$ flow rate is in the range of 0.1 to 5 sccm. If $SiH_4$ flow rate is less than 0.1 sccm, the effect of $SiH_4$ on the improvement of the morphology of the interfacial layer is insignificant. If $SiH_4$ flow rate is greater than 5 sccm, it is difficult to adjust the Si-to-$SiO_2$ selectivity to a desired value.

Preferable flow rates of $TiCl_4$ gas, $H_2$ gas and Ar gas are in the range of 1 to 30 sccm, more preferably 3 to 10 sccm, in the range of 0.1 to 5 slm, more preferably 0.5 to 2 slm, and in the range of 0.1 to 3 slm, more preferably 0.3 to 2 slm, respectively. It is preferable that the output capacity of the radio frequency power source is in the range of 100 to 800 W, more preferably 100 to 500 W, and the pressure in the vessel 1 is in the range of 0.5 to 7 torr, more preferably 1 to 5 torr.

Experiments were conducted to verify the effects of the present invention, in which Ti films were formed on a $SiO_2$ film provided with contact holes. In the experiments, the vessel 1 was evacuated to 1.0 torr, the output power of the radio frequency power source 23 (13.56 MHz) was 200 W, $H_2$ gas flow rate was 1 slm, Ar gas flow rate was 1 slm, $TiCl_4$ gas flow rate was 10 sccm, and $SiH_4$ gas flow rate was varied in the range of 0 to 5 sccm. In general, usable radio frequency of the power source 23 is from 450 kHz to 60 MHz, and preferably from 450 kHz to 13.56 MHz.

Figure 3A:
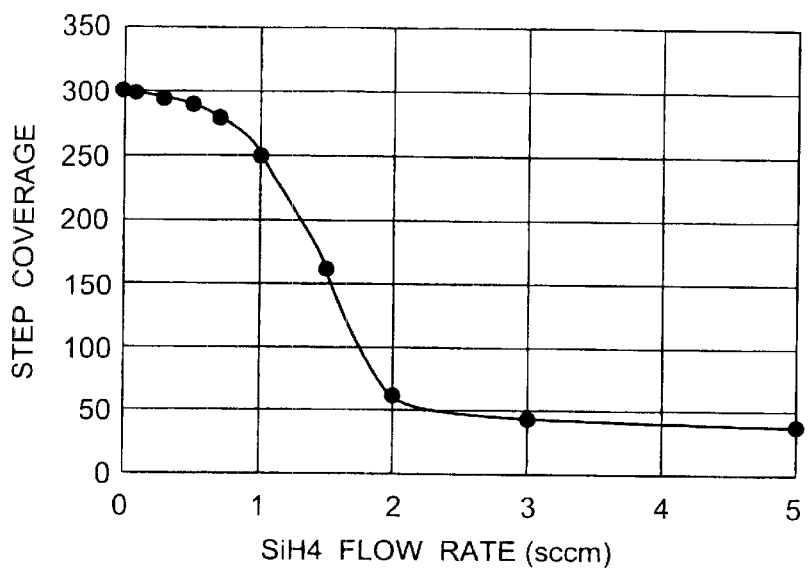
FIG. 3A is a graph showing dependence of step coverage on the flow rate of $SiH_4$ gas.

FIG. 3A is a graph showing the relationship of the step coverage with the flow rate of $SiH_4$ gas when the Si wafer was heated at 620° C. The flow rates of $TiCl_4$, Ar and $H_2$ were 10 sccm, 1 slm and 1 slm, respectively. The diameter of the holes was about 0.6 micronmeter, and the aspect ratio was about 4. As is obvious from FIG. 3A, the step coverage decreases with the increase of the $SiH_4$ flow rate.

Figure 3B:
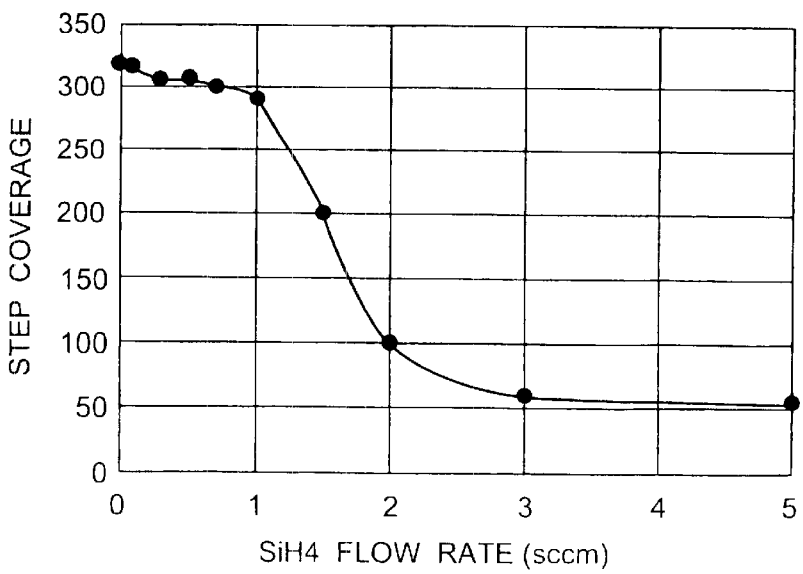
FIG. 3B is another graph showing dependence of step coverage on the flow rate of $SiH_4$ gas.

FIG. 3B is another graph showing the relationship of the step coverage with the flow rate of $SiH_4$ gas when the Si wafer was heated at 650° C. The flow rates of $TiCl_4$, Ar and $H_2$ were 10 sccm, 1 slm and 1 slm, respectively. The diameter of the holes was about 0.6 micronmeter, and the aspect ratio was about 4. As is obvious from FIG. 3B, the step coverage also decreases with the increase of the $SiH_4$ flow rate.

Figure 4:
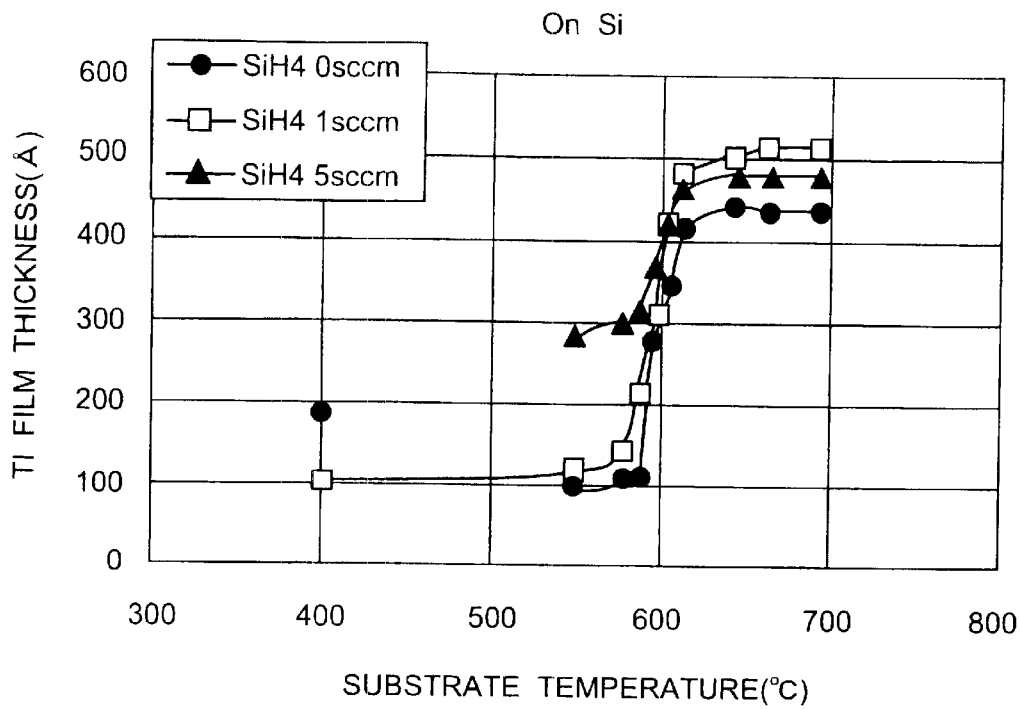
FIG. 4 is a graph showing dependence of the thickness of a Ti film formed on Si on the temperature of the Si substrate for $SiH_4$ flow rates of 0 sccm, 1 sccm and 5 sccm.
Figure 5:
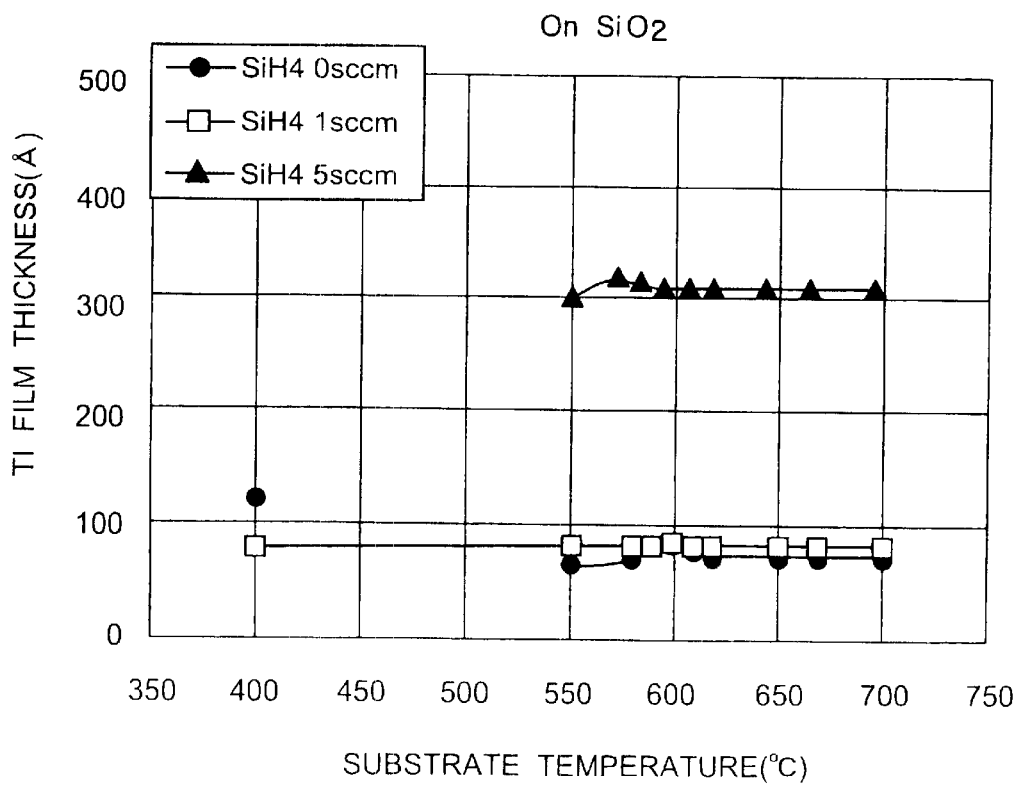
FIG. 5 is a graph showing dependence of the thickness of a Ti film formed on $SiO_2$ on the temperature of the Si substrate for $SiH_4$ flow rates of 0 sccm, 1 sccm and 5 sccm.

FIG. 4 is a graph showing the relationship of the thickness of a Ti film formed on a Si substrate with the temperature of the Si substrate, for $SiH_4$ flow rates of 0 sccm, 1 sccm and 5 sccm determined on the basis of experiments, in which the temperature of the Si substrate was changed up to 700° C. It will be noted that the Ti film thickness begins to increase when the temperature exceeds 550° C. Particularly when the temperature exceeds 580° C., the film thickness increases sharply. FIG. 5 is a graph showing the relationship of the thickness of a Ti film formed on $SiO_2$ with the temperature of the Si substrate, for $SiH_4$ flow rates of 0 sccm, 1 sccm and 5 sccm determined on the basis of experiments, in which the temperature of the Si substrate was changed up to 700° C. It is observed that the Ti film thickness does not change substantially with the temperature change. As is obvious from FIGS. 4 and 5, the Si-to-$SiO_2$ selectivity increases with the increase of the temperature of the Si substrate beyond 550° C. and is very high when the temperature of the Si substrate is 580° C. or above (practically up to 700° C.). The Si-to-$SiO_2$ selectivity is greater than one even if $SiH_4$ flow rate is as much as 5 sccm when the temperature of the Si substrate is 700° C. It is known from FIGS. 4 and 5 that the Si-to-$SiO_2$ selectivity is equal to or greater than one at $SiH_4$ flow rate in the range of 0 to 5 sccm if the temperature of the Si substrate is from 550 to 700° C. However, a flow rate of less than 0.1 of the $SiH_4$ gas has almost no effect on the improvement of the morphology of the interfacial layer, so that the lower limit of the $SiH_4$ flow rate is determined as 0.1 sccm.

This range of the flow rate (0.1 to 5 seem) of $SiH_4$ corresponds to about 0.005 to about 0.25% of the flow rate of all the processing gases and about 1 to about 50% of the flow rate of the $TiCl_4$ gas. The step coverage improves if the Si-to-$SiO_2$ selectivity increases, and an allowable step coverage can be achieved when the Si-to-$SiO_2$ selectivity is one or above.

Figure 7:
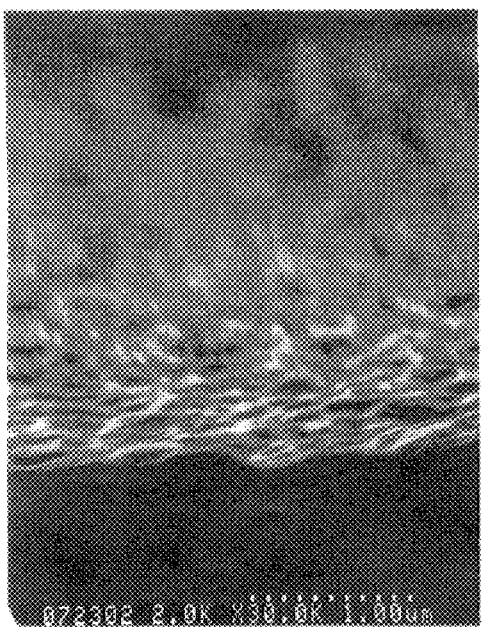
FIG. 7 is an electron micrograph of a $TiSi_x$ interfacial layer formed between a Si base and a Ti film formed on the Si base.
Figure 6:
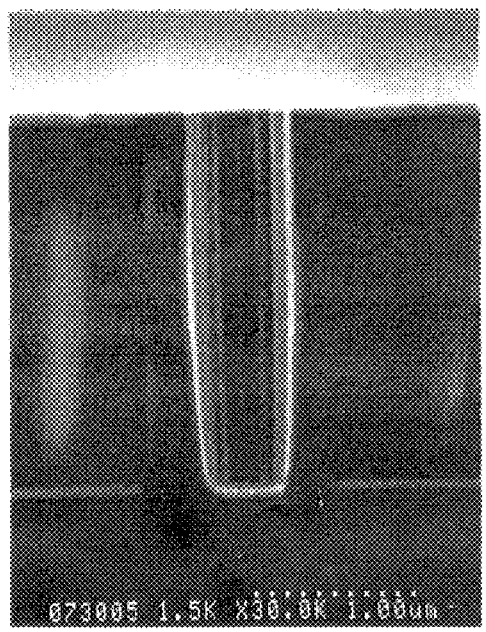
FIG. 6 is an electron micrograph of a Ti film formed in a contact hole with the substrate heated at 620° C. and $SiH_4$ supplied at 1 sccm.

FIG. 6 is an electron micrograph of a Ti film formed in a contact hole with the substrate heated at 620° C. and $SiH_4$ supplied at 1 sccm. The Ti film is formed in the contact hole in a high step coverage. FIG. 7 is an electron micrograph of a $TiSi_x$ interfacial layer formed between a Si base and a Ti film formed on the Si base by counter-diffusion between Si and Ti films. The electron microphotograph shows a Si contact base and was taken after removing the $TiSi_x$ film with dilute hydrofluoric acid. FIG. 7 proves that $SiH_4$ is effective in improving the morphology of the interfacial layer.

The experiments proved that both the morphology of the interfacial layer between the Si base and the Ti film and step coverage are satisfactory when $SiH_4$ gas is used in addition to $TiCl_4$ gas, $H_2$ gas and Ar gas, the Si substrate is heated at a temperature of from 550 to 700° C., and the flow rates of the processing gases, particularly, the flow rate of $SiH_4$ gas is controlled properly.

As described above, a process gas with a higher $SiH_4$ concentration provides $TiSi_x$ interfacial layer with a better morphology, whereas a process gas with a lower $SiH_4$ concentration provides a better step coverage. Therefore, in an early stage of a Ti deposition, the $SiH_4$ concentration may be from 20% to 50% of the $TiCl_4$ gas, or from 0.1% to 0.25% of the total gas. Following that stage, the $SiH_4$ concentration may be changed to less than 0.1% of the total gas, or less than 20% of the $TiCl_4$ gas. This process can provide the interfacial layer with a better morphology and a titanium film with a better step coverage.

Figure 8:
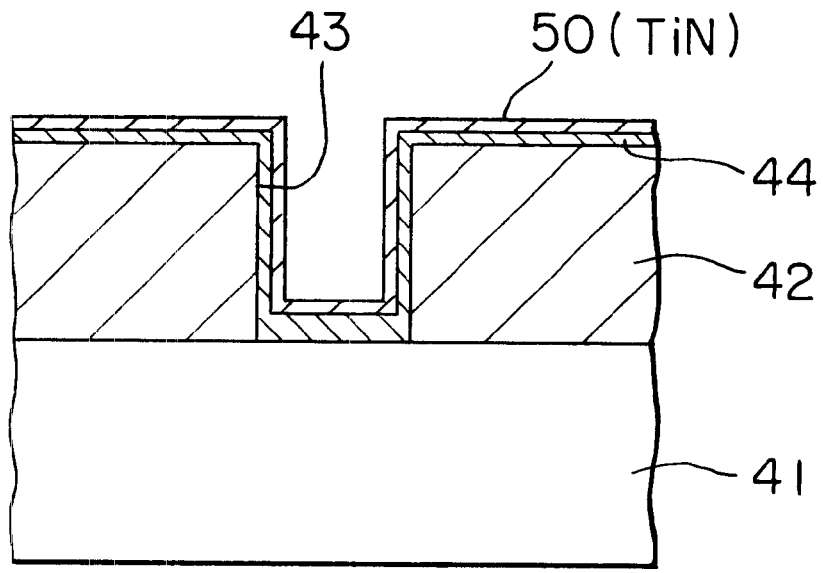
FIG. 8 is a fragmentary sectional view of a Si substrate having thereon a Ti film on which a titanium nitride film is additionally formed as a barrier film.
Figure 9:
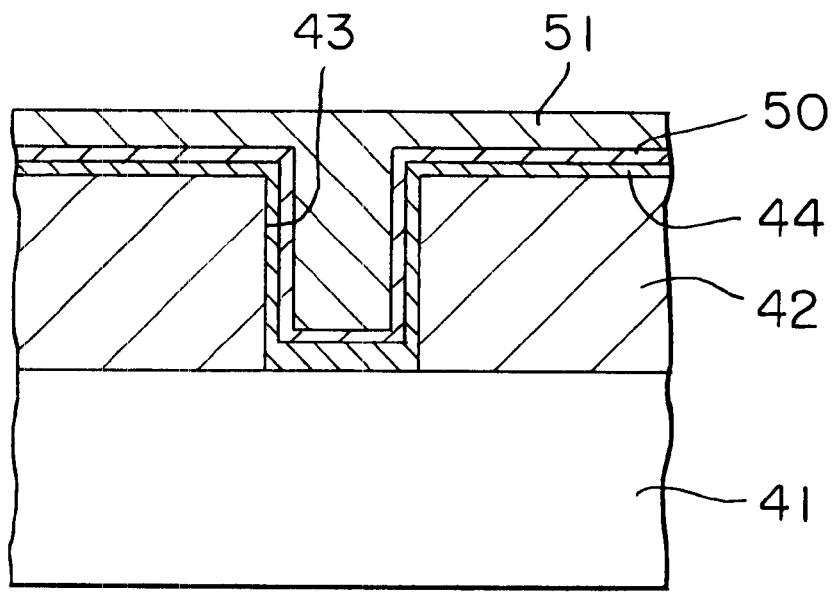
FIG. 9 is a fragmentary sectional view of the Si substrate shown in FIG. 8, in which a high melting point metal is deposited on the titanium nitride film.

The Si substrate provided with the Ti film 44 thus formed may be further formed thereon with an additional titanium nitride (TiN) barrier film 50, as shown in FIG. 8. In order to form the TiN barrier film 50, the Ti film 44 on the Si substrate is preliminarily subjected to a nitriding treatment so that the surface portion of the Ti film 44 is caused to have a nitrided surface layer. Thereafter, a process is carried out to form a TiN barrier film 50 on the nitrided surface layer. The Ti film forming step, the nitriding treatment step and the TiN barrier film forming step can be carried out in the same processing chamber such as that shown in FIG. 1. Alternatively, the Ti film forming step and the nitriding treatment step can be carried out in the same processing chamber, and the TiN barrier film forming step may be carried out in a separate processing chamber.

The nitriding treatment is carried out preferably at a pressure of from 0.5 to 10 torr, more preferably from 1 to 5 torr, and at a temperature of from 300 to 700° C., more preferably from 500 to 700° C. In the nitriding treatment, $NH_3$ and $N_2$ gases are supplied into the chamber. The flow rate of the $NH_3$ gas is from 50 to 2000 sccm, preferably from 500 to 1000 sccm. The flow rate of the $N_2$ gas is from 50 to 1000 sccm, and preferably from 100 to 500 sccm. The $N_2$ gas may not be used. Plasma could be generated during the nitriding treatment. In this case, the operating conditions are as follows:

The pressure is from 0.5 to 10 torr, more preferably from 1 to 3 torr, and the temperature is from 300 to 700° C., more preferably from 500 to 700° C. The radio frequency power applied is from 100 to 800 W, preferably 200 to 500 W. Usable radio frequency is from 450 kHz to 60 MHz, and preferably from 450 kHz to 13.56 MHz. The flow rate of the $N_2$ gas is from 50 to 1000 scam, preferably from 100 to 1000 sccm. Instead of using only the $N_2$ gas, $NH_3$ gas or ($NH_3$ and N) could be used.

The TiN barrier film forming step is carried out preferably at a pressure of from 0.1 to 10 torr, more preferably from 0.3 to 5 torr, and at a temperature of from 300 to 800° C. In the TiN barrier film forming step, TiCl$_4$ gas, NH$_3$ gas and N$_2$ gas are supplied into the processing chamber. The flow rate of the TiCl$_4$ gas is from 1 to 50 scam, preferably from 1 to 20 sccm. The flow rate of the NH$_3$ gas is from 50 to 2000 sccm, preferably from 200 to 1000 sccm, and the flow rate of the N$_2$ gas is from 50 to 2000 sccm, preferably from 100 to 1000 sccm.

After the TiN barrier film 50 is thus formed as a thin film on the Ti film, a metal 51 having a high melting point may be applied to the surface of the TiN barrier film 44 to fill the holes 43. Such high melting point metal is, for example, Al, W, AlSiCu, Cu, etc.

The present invention is not limited in its practical application to the embodiments specifically described herein. For example, other gasses may be used in addition to Ticl$_4$ gas, H$_2$ gas and Ar gas and SiH$_4$ gas, and process conditions are not limited to those described above.

Although the invention has been described in its preferred embodiments with a certain degree of particularity, it is to be understood that the embodiments are illustrative and not restrictive and many changes and variations may be made therein without departing from the scope and spirit of the invention.

What is claimed is:

1. A method of forming a titanium film by chemical vapor deposition in holes formed in an insulating film provided on a silicon base, said method comprising the steps of:

loading a silicon base having thereon an insulating film formed with holes into a film forming chamber;

evacuating the chamber at a predetermined vacuum;

supplying processing gases including TiCl$_4$ gas, a reduction gas, Ar gas and SiH$_4$ gas into the film forming chamber; and producing a plasma in the film forming chamber to deposit a titanium film in the holes formed in the insulating film, while said silicon base is heated at a temperature of from 550 to 700° C., and while said TiCl$_4$ gas and said SiH$_4$ gas are supplied with a flow rate of the SiH$_4$ gas being from 1 to 50% of a flow rate of the TiCl$_4$ gas, to thereby obtain a silicon-to-insulating film selectivity of not less than one.

2. The method of forming a titanium film by chemical vapor deposition according to claim 1, wherein the SiH$_4$ gas has a flow rate which is from 0.005 to 0.25% of the flow rate of all of the processing gases.

3. The method of forming a titanium film by chemical vapor deposition according to claim 1, wherein the reduction gas is H$_2$.

4. The method of forming a titanium film by chemical vapor deposition according to claim 1, wherein said silicon base is heated at a temperature from 580 to 700° C.

5. The method of forming a titanium film according to claim 1, wherein said TiCl$_4$ gas, H$_2$ gas, Ar gas and SiH$_4$ gas have flow rates of 1 to 30 sccm, 0.1 to 5 slm, 0.1 to 3 slm and 0.1 to 5 sccm, respectively.

6. The method of forming a titanium film by chemical vapor deposition according to claim 1, further comprising the step of:

depositing a titanium nitride barrier film on the titanium film.

7. The method of forming a titanium film according to claim 6, further comprising a step of nitriding a surface portion of the titanium film prior to said step of depositing a titanium nitride film.

8. The method of forming a titanium film according to claim 7, further comprising a step of depositing a metal film on said barrier film to fill the holes.

9. The method of forming a titanium film according to claim 1, wherein the SiH$_4$ gas is supplied with a first concentration at an early stage of the step of depositing the titanium film, and with a second concentration which is smaller than the first concentration at a later stage of the step of depositing the titanium film.

10. The method of forming a titanium film according to claim 9, wherein said first concentration of the SiH$_4$ gas is from 0.10% to 0.25% of the total gas; and said the second concentration of the SiH$_4$ gas is less than 0.10% of the total gas.

11. The method of forming a titanium film according to claim 9, wherein said first concentration of the SiH$_4$ gas is from 20% to 50% of the TiCl$_4$ gas; and said second concentration of the SiH$_4$ gas is less than 20% of the TiCl$_4$ gas.

12. A method of forming a titanium film by chemical vapor deposition in holes formed in an insulating film provided on a silicon base, said method comprising the steps of:

loading a silicon base having thereon an insulating film formed with holes into a film forming chamber;

evacuating the chamber at a predetermined vacuum;

supplying processing gases including TiCl$_4$ gas, a reduction gas, Ar gas and SiH$_4$ gas into the film forming chamber; and producing a plasma in the film forming chamber to deposit a titanium film in the holes formed in the insulating film, while said silicon base is heated at a temperature of from 630 to 700° C., and while said TiCl$_4$ gas and said SiH$_4$ gas are supplied with a flow rate of the SiH$_4$ gas being from 1 to 10% of a flow rate of the TiCl$_4$ gas, to thereby obtain a silicon-to-insulating film selectivity of not less than one.

13. The method of forming a titanium film according to claim 12, wherein the SiH$_4$ gas has a flow rate which is from 0.005 to 0.05% of the flow rate of all of the processing gases.

14. The method of forming a titanium film according to claim 12, wherein the reduction gas is H$_2$.

15. The method of forming a titanium according to claim 12, further comprising the steps of:

depositing a titanium nitride film on the titanium film.

16. The method of forming a titanium film according to claim 12, wherein the SiH$_4$ gas is supplied with a first concentration at an early stage of the step of depositing the titanium film, and with a second concentration which is smaller than the first concentration at a later stage of the step of depositing the titanium film.

17. The method of forming a titanium film according to claim 16, wherein said first concentration of the SiH$_4$ gas is from 0.10% to 0.25% of the total gas; and said the second concentration of the SiH$_4$ gas is less than 0.10% of the total gas.

18. The method of forming a titanium film according to claim 16, wherein said first concentration of the SiH$_4$ gas is from 20% to 50% of the TiCl$_4$ gas; and said second concentration of the SiH$_4$ gas is less than 20% of the TiCl$_4$ gas.

* * * * *